United States Patent
Wappis et al.

(10) Patent No.: US 10,916,321 B2
(45) Date of Patent: Feb. 9, 2021

(54) CIRCUIT WITH CAPACITORS AND CORRESPONDING METHOD

(71) Applicant: Infineon Technologies AG, Neubiberg (DE)

(72) Inventors: Herwig Wappis, Drobollach (AT); Peter Bogner, Wernberg (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/774,722

(22) Filed: Jan. 28, 2020

(65) Prior Publication Data

US 2020/0243152 A1 Jul. 30, 2020

(30) Foreign Application Priority Data

Jan. 29, 2019 (DE) .................. 10 2019 102 132

(51) Int. Cl.
G11C 27/02 (2006.01)
H03M 1/12 (2006.01)

(52) U.S. Cl.
CPC ......... *G11C 27/024* (2013.01); *H03M 1/1245* (2013.01)

(58) Field of Classification Search
None
See application file for complete search history.

(56) References Cited

U.S. PATENT DOCUMENTS

| 7,046,046 | B2 * | 5/2006 | Temes | H03M 3/486 |
| | | | | 327/91 |
| 7,209,061 | B2 * | 4/2007 | Somayajula | H03M 1/0658 |
| | | | | 341/122 |
| 9,143,148 | B2 * | 9/2015 | Nishimura | H03M 1/1061 |
| 9,154,151 | B1 * | 10/2015 | Leong | H03M 1/0863 |
| 9,319,033 | B1 * | 4/2016 | Jin | H03K 4/502 |
| 9,647,639 | B1 * | 5/2017 | Chamas | H03F 3/19 |
| 10,411,883 | B2 * | 9/2019 | Pernull | H04L 9/0662 |
| 10,419,699 | B1 * | 9/2019 | McGee, III | H04N 5/3742 |
| 2010/0123611 | A1 * | 5/2010 | Cho | H03M 1/069 |
| | | | | 341/156 |
| 2010/0194615 | A1 * | 8/2010 | Lu | H03M 3/454 |
| | | | | 341/155 |
| 2010/0309032 | A1 * | 12/2010 | Uo | H03M 3/34 |
| | | | | 341/110 |
| 2012/0062406 | A1 * | 3/2012 | Cho | H03M 1/145 |
| | | | | 341/156 |
| 2012/0249352 | A1 * | 10/2012 | Ono | H03M 1/0607 |
| | | | | 341/122 |

(Continued)

FOREIGN PATENT DOCUMENTS

DE 102013105415 A1 12/2013

*Primary Examiner* — Lincoln D Donovan
*Assistant Examiner* — Khareem E Almo
(74) *Attorney, Agent, or Firm* — Slater Matsil, LLP

(57) ABSTRACT

A circuit having capacitors, and corresponding method. A circuit and corresponding methods are provided. A controller causes a first capacitor to be connected to an input connection in a first operating phase, charge to be transferred from the first capacitor to a second capacitor in a second operating phase and charge to be transferred from the second capacitor to a processing circuit in a third operating phase. The input connection and the second capacitor belong to different voltage domains.

19 Claims, 5 Drawing Sheets

(56) References Cited

U.S. PATENT DOCUMENTS

| | | | |
|---|---|---|---|
| 2013/0076546 A1* | 3/2013 | Wan | H03M 1/1033 341/120 |
| 2013/0135126 A1* | 5/2013 | Cho | H03M 1/462 341/110 |
| 2013/0321053 A1* | 12/2013 | Bogner | H03M 1/128 327/261 |
| 2014/0168000 A1* | 6/2014 | Lemkin | H03M 1/1245 341/172 |
| 2014/0252207 A1* | 9/2014 | Okamoto | H04N 5/378 250/208.1 |
| 2014/0269011 A1* | 9/2014 | Dally | G11C 11/4096 365/149 |
| 2014/0269031 A1* | 9/2014 | Jung | G11C 11/1673 365/158 |
| 2015/0123829 A1* | 5/2015 | Kim | G06G 7/184 341/143 |
| 2015/0372691 A1* | 12/2015 | Mandal | H03M 1/38 341/110 |
| 2019/0140627 A1* | 5/2019 | Park | G09G 3/2096 |
| 2019/0280705 A1* | 9/2019 | Bodnar | H03M 1/124 |
| 2019/0348098 A1* | 11/2019 | El-Mansouri | G11C 8/08 |
| 2020/0162095 A1* | 5/2020 | Bodnar | H03M 1/802 |

* cited by examiner

CIRCUIT WITH CAPACITORS AND CORRESPONDING METHOD

This application claims the benefit of German Patent Application No. 102019102132.4, filed on Jan. 29, 2019, which application is hereby incorporated herein by reference in its entirety.

TECHNICAL FIELD

The present application relates to circuits having capacitors, for example sampling circuits or sample-and-hold circuits, and corresponding methods.

BACKGROUND

In a good many applications, it is desirable to sample input signals at relatively high voltage and then to process them further using circuit sections that are designed for a lower voltage and are supplied with a lower voltage. By way of example, in a good many automotive applications, such input signals can have voltages in the 10 to 40 V range, and they are then processed further by processing circuits, for example analog-to-digital converters, that are operated at a supply voltage of 1.5 V and are designed for said supply voltage. These voltage values should merely be regarded as an example.

Various solutions are known that have resistive divider circuits, for example. These resistive divider circuits frequently require a buffer having a corresponding area requirement on a chip. Other solutions use capacitive circuits or capacitor-based sampling circuits that involve a capacitor being connected to the input signal in a first operating phase, also referred to as the sampling phase, and the capacitor being isolated from the input signal and the charge on the capacitor being processed further, for example being converted into a digital value by means of an analog-to-digital converter circuit, in a second operating phase, also referred to as the conversion phase. For the purpose of selectively connecting the input signal to the capacitor, transistors designed for the comparatively high voltage of the input signal are frequently used in this case.

Such transistors frequently have a parasitic reverse diode, for example inherently present in the structure of the transistor as what is known as a body diode or bulk diode. If the input signal varies comparatively quickly, for example as a result of what is known as "ringing", there is the possibility of charge draining from the capacitor via this parasitic reverse diode in the second operating phase.

SUMMARY

In accordance with one exemplary embodiment, a circuit is provided that comprises a signal input, a first capacitor, a second capacitor and a processing circuit. The circuit furthermore comprises a controller, which is configured: to connect the first capacitor to the signal input in a first operating phase, to cause charge to be transferred from the first capacitor to the second capacitor in a second operating phase, and to cause charge to be transferred from the second capacitor to the processing circuit in a third operating phase. The signal input belongs to a first voltage domain, and the second capacitor belongs to a second voltage domain. The first voltage domain is independent of the second voltage domain.

In accordance with a further exemplary embodiment, a circuit is provided that comprises a signal input for applying a voltage, a sampling capacitor, a hold capacitor, a measuring circuit and a control circuit. The control circuit is designed such that the sampling capacitor is charged using a voltage applied to the signal input in a sampling phase, charge is transferred from the sampling capacitor to the hold capacitor in a holding phase and charge is transferred from the hold capacitor to the measuring circuit in a conversion phase. The signal input is associated with a first voltage domain, and the hold capacitor is associated with a second voltage domain. The first voltage domain is decoupled from a second voltage domain.

In accordance with a further exemplary embodiment, a method is provided that comprises: charging a first capacitor using an input voltage in a first operating phase, transferring charge from the first capacitor to a second capacitor in a second operating phase, and transferring charge from the second capacitor to a processing circuit in a third operating phase. The input voltage is associated with a different, independent voltage domain than the second capacitor.

The above summary merely provides a brief overview of some exemplary embodiments and should not be interpreted as limiting.

DETAILED DESCRIPTION OF ILLUSTRATIVE EMBODIMENTS

Exemplary embodiments are explained in detail below. These exemplary embodiments are merely used for illustration and should not be interpreted as limiting.

Besides the explicitly depicted and described components of the exemplary embodiments, further components, for example components used in conventional sampling circuits, may be provided. Features and components of different exemplary embodiments can be combined with one another. Variations and modifications that are described for one of the exemplary embodiments can also be applied to other exemplary embodiments and are therefore not described repeatedly.

Connections or couplings described within the context of this application are electrical connections or couplings unless explicitly indicated otherwise. Electrical connections or couplings of this kind can be modified so long as the fundamental function of the connection or coupling, for example transferring a voltage, transferring a control signal or transferring charge, is maintained.

Figure 1:
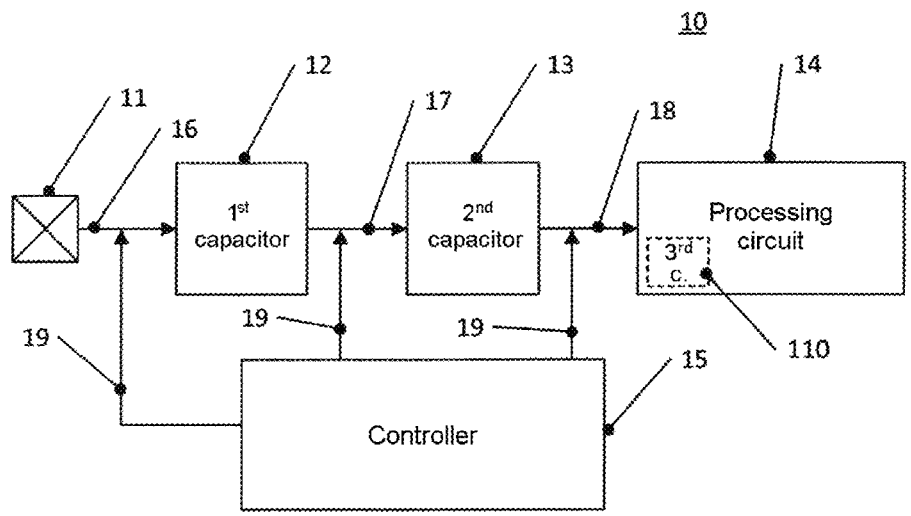
FIG. 1 is a block diagram of a circuit in accordance with an exemplary embodiment.

FIG. 1 shows a block diagram of a circuit 10 in accordance with an exemplary embodiment. The circuit 10 of FIG. 1 has a signal input 11, a first capacitor 12, a second capacitor 13, a processing circuit 14 and a controller 15. Within the context of the present application, the term "capacitor" denotes any device that provides a capacitance in order to accept charge, as explained in more detail below.

Capacitors for this purpose may be formed by individual discrete components, for example, but also by multiple interconnected single capacitors, for example an array of single capacitors, possibly in combination with further components.

Figure 6:
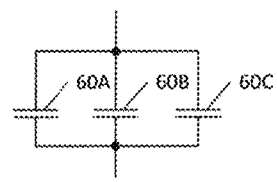
FIG. 6 shows an example of a capacitor as is useful in exemplary embodiments.

An example of such an array of single capacitors that is able to be used to implement the first capacitor or the second capacitor is shown in FIG. 6. In this case, multiple single capacitors 60A, 60B, 60C (in this example three single capacitors) are connected in parallel in order to provide a corresponding capacitance of the first capacitor 12 or of the second capacitor 13. Other arrangements are also possible. As such, such an arrangement can additionally have switches by means of which single capacitances are selectively activated and deactivated. This allows a capacitance of the capacitor to be set, for example for the purpose of setting a capacitance ratio between the first capacitor 12 and the second capacitor 13.

As an example, the first capacitor 12 can have a capacitance between 1 and 100 fF, for example approximately 10 fF. The second capacitor 13 can have a larger capacitance than the first capacitor 12, for example a capacitance that is higher by a factor of between 5 and 50. By way of example, the second capacitor 13 can have a capacitance that is higher than that of the first capacitor 12 by a factor of 25, for example. These numerical values should be understood only as an example, however, and other values are also possible.

During operation of the circuit 10, as will be explained in more detail below, an input voltage to be sampled is applied to the signal input 11. Charge in accordance with this input voltage is transferred via the first capacitor 12 and the second capacitor 13, as explained in more detail below, to the processing circuit 14, in order to be processed further therein. To this end, the processing circuit 14 can comprise an analog-to-digital converter circuit, for example, which outputs a digital value corresponding to the input voltage.

In the case of the circuit 10, the input connection 11 is associated with a first voltage domain, and the second capacitor 13, the processing circuit 14 and the controller 15 are associated with one or more further voltage domains. A voltage domain within the context of this application denotes a section of a circuit that is designed for a specific voltage range and/or is supplied with a specific supply voltage. "Designed" in this case means for example that components in the respective voltage domain are constructed such that they operate correctly in terms of function in the respective voltage range of the voltage domain.

The first capacitor 12 may likewise be associated with the first voltage domain of the signal input 11.

The first voltage domain, with which the voltage input 11 is associated, may be designed for a higher voltage range than the further voltage domains, for example. That is to say that circuit sections that are in the first voltage domain are dimensioned such that they tolerate a first maximum voltage. The first maximum voltage is higher, in terms of absolute value, than the further maximum voltages for which those circuit sections that are in the further voltage domains are designed. By way of example, input voltages having a maximum voltage level in the range above 10 V, for example up to 30 V, up to 120 V or above, can be applied to the input connection 11. Additionally, the first voltage domain can be supplied with a higher voltage than the further voltage domains, for example. The further voltage domains can then operate at lower voltages and/or be supplied with lower voltages, for example 5.5 V, 3 V or 1.5 V. In the case of negative voltages with reference to a reference-ground potential, these statements apply accordingly. The first voltage domain therefore has higher voltages and/or higher voltage differences, in terms of absolute value, than the further voltage domains.

In some exemplary embodiments, there is only one further voltage domain, with which for example the second capacitor 13, the processing circuit 14 and the controller 15 are associated. In other exemplary embodiments, multiple further voltage domains may be provided. By way of example, the second capacitor 13 can belong to a second voltage domain and be designed for voltages of up to 5.5 V, for example, while the processing circuit 14 is associated with a third voltage domain that operates at a supply voltage of 1.5 V, for example.

The voltage domains are decoupled, in this case capacitively decoupled, from one another by the capacitors 12, 13, for example, and hence independent of one another or insulated from one another. In one embodiment, the independent voltage domains have a common reference-ground potential or a common reference-ground voltage, for example ground. In another embodiment, the independent voltage domains have no common reference-ground potential or no common reference-ground voltage. Large voltage differences can arise between the individual voltage domains. The above voltage values serve merely as an illustrative example, and other voltage values are also possible.

The controller 15 controls the operation of the circuit 10, as described below. To this end, the controller 15 can have one or more switches and one or more components for controlling the operation of the switches. Such components can contain for example a microcontroller, a logic circuit, an application-specific integrated circuit (ASIC), a field-programmable gate arrangement (FPGA) or combinations of these. Switches may be formed for example by transistors, such as bipolar transistors, field-effect transistors or insulated gate bipolar transistors (IGBTs).

The control of the operation of the circuit 10 by the controller 15 is indicated by arrows 19 in FIG. 1.

In a first operating phase, which is also referred to as the sampling phase, the signal input 11 is connected to the first capacitor 12, as indicated by an arrow 16, so that the first capacitor 12 is charged in accordance with the input voltage at the signal input 11. In a second operating phase, charge is transferred from the first capacitor 12 to the second capacitor 13, as indicated by an arrow 17. This second operating phase can also be referred to as the holding phase or intermediate phase. Accordingly, the first capacitor 12 can also be referred to as a sampling capacitor and the second capacitor 13 can also be referred to as a hold capacitor. In exemplary embodiments, the second operating phase is directly subsequent to the first operating phase and/or can overlap it.

In a third operating phase (conversion phase), which is indicated by an arrow 18 in FIG. 1, charge is then transferred from the second capacitor 13 to the processing circuit 14 for further processing, for example for analog-to-digital conversion. This third operating phase is also referred to as the conversion phase. The second operating phase may be relatively long, which means that the third operating phase can be performed at an interval of time from the first operating phase. It is therefore possible, in some exemplary embodiments, for the processing by the processing circuit 14 to take place at a separate time from the first operating phase and hence a sampling time. The length of the second operating phase is substantially limited by leakage currents, which can lead to loss of charge from the second capacitor 13. Depending on the implementation, periods of up to 100 µs or up to 1 ms are possible for the second operating phase, for example.

The operating phases can then be repeated, with substantially any interval of time from a next performance of the operating phases being possible.

In some exemplary embodiments, the processing circuit can have a third capacitor no to which charge is transferred from the second capacitor 27 in the third operating phase. The third capacitor is also a capacitor as explained above, i.e. generally a device that provides capacitance, and may be designed for multiple single capacitors and for example be a capacitor array, as has been explained above with reference to FIG. 6.

The transfer of the charge from the first capacitor 12 to the second capacitor 13 "secures" the charge, as it were. This makes it possible to avoid, in some exemplary embodiments, a change in the input voltage at the input connection 11 resulting in charge being able to drain again and hence distorting the result, for example by draining via a parasitic reverse diode as described at the outset.

Figure 2:
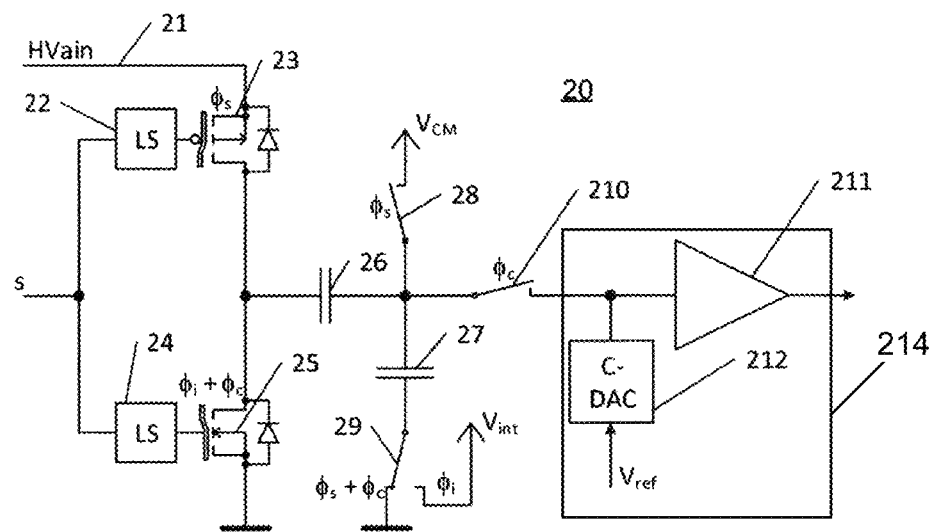
FIG. 2 is a circuit diagram of a circuit in accordance with an exemplary embodiment.

FIG. 2 shows a circuit 20 in accordance with an exemplary embodiment. The circuit 20 shows by way of example possible circuit implementations of different components, which are explained with reference to FIG. 1.

The circuit 20 has an input connection 21 that is used for applying an input voltage HVain as input signal. The input voltage HVain can be a relatively high voltage, as already explained with reference to FIG. 1. The input connection 21 is associated with a first voltage domain.

The circuit 20 furthermore has a first capacitor 26 and a second capacitor 27, the function of which capacitors corresponds to the first capacitor 12 and the second capacitor 13 of FIG. 1, as will be explained in more detail below. The capacitors 26, 27 are depicted as individual capacitors in FIG. 2, but they may also be implemented by arrangements of multiple capacitors, as already explained with reference to FIG. 6.

A first connection of the first capacitor 26 is connected to the signal input 21 via a switch 23 and to ground via a switch 25. Instead of ground, another reference-ground potential could also be used. The switches 23 and 25 and the first capacitor 26 are designed for the voltage HVain, which, as explained, can be a comparatively high voltage. In the example depicted, the switches 23 and 25 are each implemented as transistors, as depicted. The transistors each have, as depicted, a parasitic reverse diode, for example a body diode or bulk diode. Parasitic reverse diodes of this kind are frequently present in transistors designed for comparatively high voltages.

The switches 23, 25 are controlled by a control signal s from a control component (not depicted in FIG. 2, cf. the explanations pertaining to the controller 15 of FIG. 1) such that when the switch 23 is closed, i.e. the applicable transistor is conductive between source and drain, the switch 25 is off, and vice versa. The control signal s can be generated by a control component that belongs to a voltage domain having a relatively low voltage. In order to be able to switch the transistors of the switches 23, 25, level shifters 22, 24 may thus be provided. The level shifter 22 may be designed as a charge pump, for example, in order to take the signal s as a basis for producing a relatively high voltage to turn the transistor of the switch 23 on and off.

A second connection of the first capacitor 26 is connected to a first connection of the second capacitor 27 and, via a switch 28, to a positive voltage VCM. The positive voltage VCM is for example the common mode voltage of a processing circuit, described later on, and is provided by said processing circuit. Instead of this common mode voltage, other exemplary embodiments can also involve the use of a supply voltage from a voltage domain to which the switch 28 and the second capacitor 27 and possibly further switches 29 and 210, which are explained later on, belong.

A second connection of the second capacitor 27 is connectable either to ground or to an intermediate voltage $V_{int}$ via a changeover switch 29. The voltage $V_{int}$ is greater than ground and can be for example a supply voltage for a downstream analog-to-digital converter 214, of which components 211, 212 are indicated. The higher the voltage $V_{int}$ is chosen, the smaller the dimensions of $C_{int}$ can be. In some exemplary embodiments, the changeover switch 29 can also be omitted and the second connection of the second capacitor 27 can be permanently connected to ground. In that case, a capacitance value of the second capacitor 27 is relatively large in the exemplary embodiments. Instead of the changeover switch 29, two separate switches may also be provided that are alternately open and closed. Capacitance values of the first capacitor 26 and of the second capacitor 27 can be chosen as explained above for the capacitors 12, 13 of FIG. 1, but are not restricted thereto.

The second connection of the first capacitor 26 and the first connection of the second capacitor 27 are connected via a switch 210 to a processing circuit, which in this case is indicated as a successive approximation register analog-to-digital converter (SAR-ADC) 214 having a digital-to-analog converter 212, to which a reference voltage $V_{ref}$ is supplied, and an amplifier 211. Other types of analog-to-digital converters or other processing circuits, for example measuring circuits that measure a supplied charge and output a value of the charge, may also be implemented. The switches 28, 29 and 210 may be implemented as corresponding transistors. Since the switches 28, 29 and 210 are designed for lower voltages than the switches 23, 25, symmetrical transistors without a parasitic reverse diode, which are designed for lower voltages, can be used in the present case.

In FIG. 2, the analog-to-digital converter 214 may be associated with a third voltage domain, which can operate at a lower voltage than the second voltage domain, for example. It may alternatively be associated with a second voltage domain, with which the second capacitor 27 and the switches 28, 29 and 210 are also associated. If a second and a third voltage domain are present, these can both have a lower voltage than the first voltage domain, with which the input connection 21, the transistors 23 and 25, the level shifters 22 and 24 and the first capacitor 26 are associated. The first capacitor 26 provides a dielectric isolation between the first voltage domain and the second voltage domain in this case.

Next, the operation of the circuit 20 of FIG. 2 is explained.

The circuit of FIG. 2 is operated in three operating phases. A first operating phase, also referred to as the sampling phase, is denoted by ϕs, a second operating phase, also referred to as the holding phase or intermediate phase, is denoted by ϕi, and a third operating phase, also referred to as the conversion phase, is denoted by ϕc. In FIG. 2, the switches are each marked with the operating phases ϕs, ϕi, ϕc, in which they are closed. This holds for the case in which the input voltage HVain is greater than the reference-ground potential (ground in FIG. 2). Changes that result in the case of negative input voltages (HVain less than the reference-ground potential) are explained later on.

In the first operating phase, the switch 23 and the switch 28 are closed and the changeover switch 29 connects the second connection and the second capacitor 27 to ground.

The first capacitor 26 is therefore connected to the input connection 21 via the transistor 23 and is charged in accordance with the voltage HVain. The switch 25 and the switch 210 are open in the first operating phase.

At the beginning of the second operating phase (holding phase), the switch 28 is opened, which fixes the total charge on the capacitors 26, 27 (apart from leakage effects) and therefore defines the sampling time. Immediately afterward, the switch 23 is opened and the switch 25 is closed, so that the first connection of the first capacitor 26 is connected to ground. In exemplary embodiments, the second operating phase is immediately subsequent to the first operating phase. The switch 210 remains open, and the changeover switch 29 connects the second connection of the second capacitor 27 to the voltage $V_{int}$. In this second operating phase, the charge is transferred from the first capacitor 26 to the second capacitor 27. This secures the charge, as it were. If the voltage HVain now falls, the charge secured on the second capacitor 27 in this manner cannot drain via the parasitic reverse diode of the transistor of the switch 23 even in the case of low voltages HVain. The third operating phase that now follows can therefore also take place at an interval of time from the first operating phase by virtue of the second operating phase taking an appropriate length of time without a fluctuating, for example falling, voltage HVain distorting a result of the subsequent analog-to-digital conversion.

In the third operating phase, the switch 210 is first closed. The switch 23 and the switch 28 remain open, and the transistor 25 remains on. The changeover switch 29 connects the second connection of the second capacitor 27 to ground. As a result, the charge is transferred from the second capacitor 27 to the analog-to-digital converter 214 via the switch 210, the connection of the second connection of the second capacitor to ground ensuring that the charge is transferred with reference to the correct reference-ground potential. The charge can then be converted into a digital value, for example, by the analog-to-digital converter 214. The digital-to-analog converter 212 can be a capacitive digital-to-analog converter having a capacitor array, for example, and charge is transferred from the second capacitor 27 to the capacitor array of the digital-to-analog converter 212 in the third operating phase when the switch 210 is closed.

If the voltage HVain is a negative voltage with reference to the reference-ground potential (e.g. ground), the positions of the changeover switch 29 are reversed in some exemplary embodiments, as explained above for a positive voltage HVain. In this case, the switch 29 thus connects the second connection of the second connector 27 to ground in the second operating phase and to the voltage $V_{int}$ in the first and third operating phases.

Similarly, the switches 23, 25 and the level shifters 22, 24 also need to be matched to the negative input voltage range in this case, which means that the parasitic reverse diodes are reverse-biased and the gate actuation of the transistors of the switches 23, 25 takes place at the correct potential.

It should be noted that the circuit depicted in FIG. 2 is merely an example. As such, instead of the PMOS transistors depicted, NMOS transistors can also be used. Moreover, some of the depicted switches can also be replaced by resistors. As such, for example the switch 23 can be replaced by a resistor and the switch 25 can be implemented by means of an NMOS transistor. Such a solution requires less chip area, but leads to a higher power consumption on account of parallel currents via the resistor.

Spacing of the timing of the third operating phase from that of the first operating phase as mentioned above can be used for example in cases in which an input signal is sampled by multiple circuit sections at staggered times and then processed in a common processing circuit. This can be used if a higher sampling rate is needed than an HV input switch (e.g. the switch 23 in FIG. 2) could accomplish. This will now be explained with reference to FIG. 3.

Figure 3:
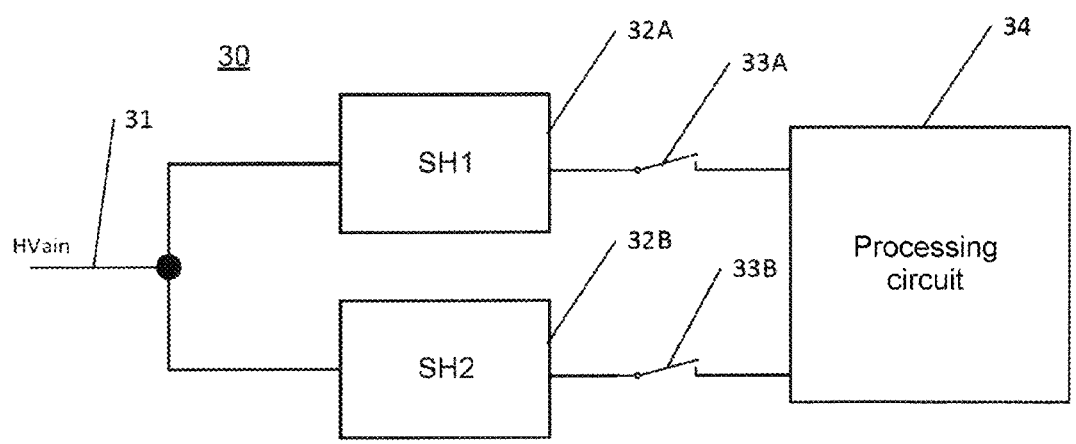
FIG. 3 is a block diagram of a circuit in accordance with an exemplary embodiment.

FIG. 3 shows a circuit 30 in accordance with an exemplary embodiment. The circuit 30 has a signal input 31 for receiving an input voltage HVain. This input voltage is supplied to two sample-and-hold circuits 32A, 32B, which each have a first capacitor and a second capacitor, which can be operated as explained with reference to FIG. 1 or 2, so that the respective first capacitor is charged using the voltage HVain in a first operating phase and the charge is then transferred to the respective second capacitor in a second operating phase.

In the third operating phase, the charge is then transferred from the second capacitor to a processing circuit 34 for the first sample-and-hold circuit 32A by closing a switch 33A, and to the processing circuit 24 for the second sample-and-hold circuit 32B by closing a switch 33B. The switches 33A, 33B can correspond, in terms of their function, to the switch 210 of FIG. 2. The processing circuit 35 can be for example an analog-to-digital converter or another measuring circuit, as explained with reference to FIGS. 1 and 2.

It should be noted that the number of two sample-and-hold circuits 32A, 32B in FIG. 3 is only an example, and more than two such circuits can also be provided in order to allow sampling at staggered sampling times.

Figure 4:
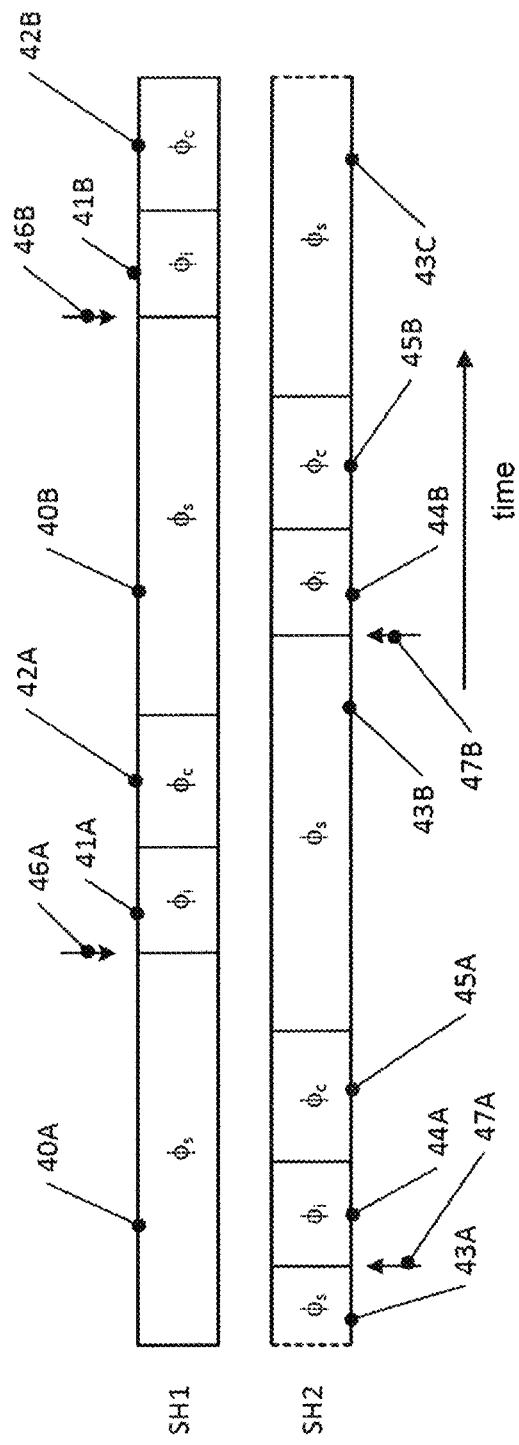
FIG. 4 shows a diagram to illustrate a timing sequence for operation of the circuit of FIG. 3.

An example of a timing sequence for the three operating phases in the circuit 30 is depicted in FIG. 4, wherein the designations φs, φi and φc are used as in FIG. 2.

For the first sample-and-hold circuit 32A, the first operating phases are denoted by the reference sign 40 (40A and 40B), the second operating phases are denoted by the reference sign 41 (41A and 41B) and the third operating phases are denoted by the reference sign 42 (42A and 42B). For the second sample-and-hold circuit 32B, the first operating phases are denoted by the reference sign 43 (43A, 43B, 43C), the second operating phases are denoted by the reference sign 44 (44A, 44B), and the third operating phases are denoted by the reference sign 45 (45A, 45B). Arrows 46 (46A, 46B) show the sampling times of the first sample-and-hold circuit 32A, and arrows 47 (47A, 47B) show the sampling times of the second sample-and-hold circuit 32B.

As can be seen, the second operating phases are each immediately subsequent to the respective first operating phases, and the respective third operating phases follow the respective second operating phases. As a result, the third operating phases take place at an interval of time from the respective first operating phases. This allows the voltage HVain to be sampled at short intervals of time (e.g. at the sampling times 43A and 43B), while the processing in the processing circuit 34 can then take place later in a manner temporally independent of the choice of the sampling times, a maximum interval of time between the respective first operating phase and the respective second operating phase being limited in accordance with the length of the third operating phase situated between each of these substantially as a result of loss of charge as a result of leakage currents, as explained with reference to FIG. 1. The use of the second capacitor makes it possible to ensure, in some exemplary embodiments, as already explained above, that a change, for example a fall, in the voltage HVain does not result in any charge being lost, which would distort the result. The lengths of the respective first sampling phases are not limited and can be chosen according to requirements.

Whereas, in the example of FIG. 4, the sampling times are at staggered times in accordance with the arrows 46, 47 of the sample-and-hold circuits 32A, 32B, they can also be at the same time for both sample-and-hold circuits. Different lengths of the second operating phases 41, 44 in both sample-and-hold circuits 32A, 32B then allow the third operating phases 42, 45 to be at staggered times in relation to one another and hence the processing to be performed in the same processing circuit 34. The sample-and-hold circuits 32A, 32B can also sample different voltages at the same time, for example by virtue of each of the sample-and-hold circuits 32A, 32B being connected to a separate input connection. This can lead to a high level of accuracy for the measurement of voltage differences, since an offset of the processing circuit 34 used for both sample-and-hold circuits 32A, 32B is removed in a difference formation.

In the exemplary embodiments above, single-ended implementations have been depicted. A differential implementation is likewise possible. In this case, a differential input having two input connections is provided, and the circuits having a first capacitor and a second capacitor that were discussed with reference to FIGS. 1 and 2 are doubled as it were, i.e. provided separately for both input connections.

Figure 5:
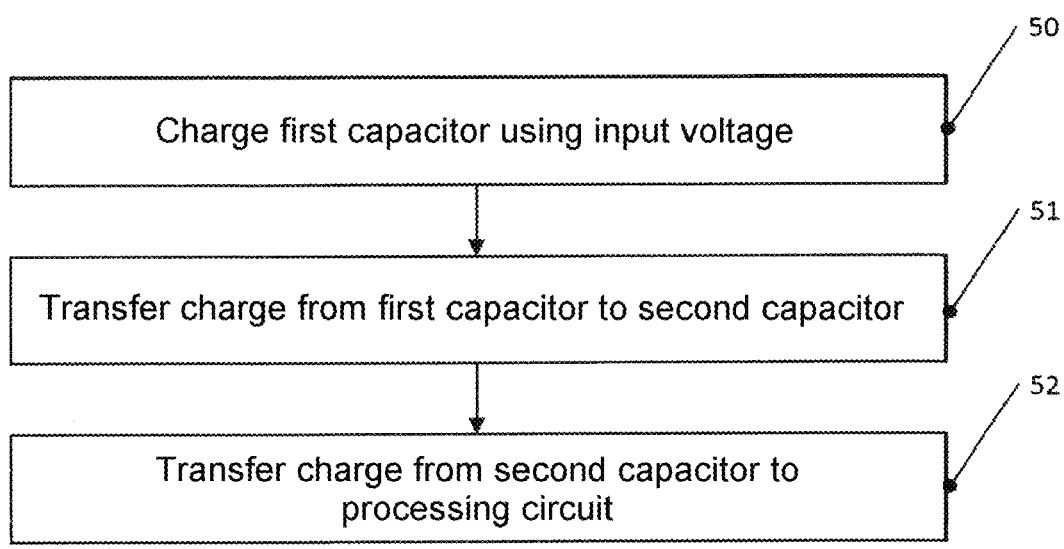
FIG. 5 is a flowchart to illustrate methods in accordance with various exemplary embodiments.

FIG. 5 depicts a flowchart for a method to illustrate methods in accordance with various exemplary embodiments. The method of FIG. 5 can be performed using the circuits discussed with reference to FIGS. 1 to 4, but is not restricted thereto. To avoid repetition, however, the method of FIG. 5 will be explained with reference to the previous description of FIGS. 1 to 4, and the different variants discussed for the circuits of FIGS. 1 to 3 are accordingly also usable for the method of FIG. 5 and are therefore not explained explicitly again.

At 50, a first capacitor (for example the first capacitor 12 of FIG. 1 or the first capacitor 26 of FIG. 2) is precharged using an input voltage in a first operating phase.

At 51, charge is then transferred from the first capacitor to a second capacitor in a second operating phase. The second capacitor belongs to a different voltage domain than the first capacitor. The second capacitor may be the capacitor 13 of FIG. 1 or the capacitor 27 of FIG. 2, for example.

At 52, charge is transferred from the second capacitor to a processing circuit (for example the processing circuit 14 of FIG. 1 or the analog-to-digital converter 214 of FIG. 2) in a third operating phase. This transferring can take place for example to a third capacitor of the processing circuit, for example the capacitor 110 of FIG. 1 or a capacitor array of the digital-to-analog converter 212 of FIG. 2.

The second operating phase at 51 can be immediately subsequent to the first operating phase at 50, while the third operating phase at 52 is at an interval of time from the first operating phase at 50 as a result of the second operating phase at 51. The first operating phases at 50 can thus also be performed, as explained with reference to FIG. 4, at staggered times in different sample-and-hold circuits having a respective first capacitor and second capacitor, and the respective third operating phases can then be performed at an interval of time therefrom as a result of the second operating phases.

A few exemplary embodiments are defined by the following examples:

Example 1. A circuit comprising: a signal input, a first capacitor, a second capacitor,
a processing circuit, and a controller, which is configured: to connect the first capacitor to the signal input in a first operating phase, to cause charge to be transferred from the first capacitor to the second capacitor in a second operating phase, and to cause charge to be transferred from the second capacitor to the processing circuit in a third operating phase, wherein the signal input belongs to a first voltage domain and the second capacitor belongs to a second voltage domain, the first voltage domain being independent of the second voltage domain.

Example 2. The circuit according to example 1, wherein the first voltage domain has higher voltages and/or higher voltage differences, in terms of absolute value, than the second voltage domain.

Example 3. The circuit according to example 1 or 2, wherein the processing circuit is associated with the second voltage domain.

Example 4. The circuit according to example 1 or 2, wherein the processing circuit is associated with a third voltage domain, which is independent of the first voltage domain and has lower voltages and/or lower voltage differences, in terms of absolute value, than the first voltage domain.

Example 5. The circuit according to one of examples 1 to 4, wherein the controller comprises a first switch between the signal input and a first connection of the first capacitor and a second switch between the first connection of the first capacitor and a reference-ground potential, wherein the controller is configured to close the first switch in the first operating phase and to open it in the second and third operating phases and to open the second switch in the first operating phase and to close it in the second and third operating phases.

Example 6. The circuit according to example 5, wherein the first switch and the second switch are associated with the first voltage domain.

Example 7. The circuit according to example 5 or 6, wherein the first switch and/or the second switch comprises a transistor having a parasitic reverse diode.

Example 8. The circuit according to one of examples 5 to 7, wherein the controller comprises a third switch between the second connection of the first capacitor and a common-mode voltage, wherein the controller is configured to close the third switch in the first operating phase and to open it in the second and third operating phases.

Example 9. The circuit according to one of examples 5 to 8, wherein a second connection of the first capacitor is connected to a first connection of the second capacitor.

Example 10. The circuit according to example 9, wherein the controller comprises a fourth switch arranged between the first connection of the second capacitor and the processing circuit, wherein the controller is configured to close the fourth switch in the third operating phase and to open it in the first and second operating phases.

Example 11. The circuit according to either of examples 9 and 10, wherein the controller is configured to connect a second connection of the second capacitor to the reference-ground potential in the first and third operating phases and to connect it to a further reference-ground potential, which is greater than the reference-ground potential, in the second operating phase.

Example 12. The circuit according to either of examples 9 and 10, wherein the controller is configured to connect the second connection of the second capacitor to the reference-ground potential in the second operating phase/holding phase and to connect it to a further reference-ground potential, which is greater than the reference-ground potential, in the first and third operating phases.

Example 13. The circuit according to either of examples 11 and 12, wherein the further reference-ground potential is a supply voltage of the processing circuit.

Example 14. The circuit according to one of examples 1 to 13, wherein the processing circuit comprises a third capacitor, wherein the controller is configured to transfer charge from the second capacitor to the third capacitor in the third operating phase.

Example 15. The circuit according to one of examples 1 to 14, wherein the first capacitor, the second capacitor and/or the third capacitor comprises multiple single capacitors.

Example 16. A circuit comprising: a signal input for applying a voltage (HVain), a sampling capacitor, a hold capacitor, a measuring circuit, and a control circuit, which is designed such that the sampling capacitor is charged using the voltage applied to the signal input in a sampling phase, charge is transferred from the sampling capacitor to the hold capacitor in a holding phase, and charge is transferred from the hold capacitor to the measuring circuit in a conversion phase, wherein the signal input is associated with a first voltage domain, wherein the hold capacitor is associated with a second voltage domain, and wherein the first voltage domain is decoupled from the second voltage domain.

Example 17. The circuit according to example 16, wherein the circuit comprises a transistor associated with the first voltage domain and having a parasitic reverse diode, wherein the control circuit is configured to turn on the transistor to charge the sampling capacitor.

Example 18. The circuit according to example 16 or 17, wherein the second capacitor, the processing circuit and/or the control circuit are designed for a lower voltage, in terms of absolute value, than the signal input.

Example 19. A method comprising: charging a first capacitor using an input voltage (HVain) in a first operating phase, transferring charge from the first capacitor to a second capacitor in a second operating phase, and transferring charge from the second capacitor to a processing circuit in a third operating phase, wherein the input voltage (HVain) is associated with a first voltage domain and the second capacitor is associated with a second voltage domain, which is independent of the first voltage domain.

Example 20. The method according to example 19, wherein the transferring of the charge from the second capacitor to the processing circuit comprises charging a third capacitor of the processing circuit.

Example 21. The method according to example 19 or 20, further comprising charging a further first capacitor using the input voltage or a further input voltage in a further first operating phase and transferring charge from the further first capacitor to a further second capacitor in a further second operating phase.

Although specific exemplary embodiments have been illustrated and described in this description, persons having standard knowledge in the art will recognize that a multiplicity of alternative and/or equivalent implementations can be chosen as a substitution for the specific exemplary embodiments shown and described in this description without departing from the scope of the invention shown. It is the intention for this application to cover all adaptations or variations of the specific exemplary embodiments that are discussed in the present case. It is thus intended that this invention be restricted only by the claims and the equivalents of the claims.

What is claimed is:
1. A circuit comprising:
a first capacitor,
a second capacitor,
a processing circuit, and
a controller configured to:
connect the first capacitor to a signal input in a first operating phase,
cause charge to be transferred from the first capacitor to the second capacitor in a second operating phase, and
cause charge to be transferred from the second capacitor to the processing circuit in a third operating phase, wherein the signal input belongs to a first voltage domain, the second capacitor belongs to a second voltage domain, and the first voltage domain is independent of the second voltage domain, wherein the first voltage domain has higher voltages and/or higher voltage differences, in terms of absolute value, than the second voltage domain.

2. The circuit as claimed in claim 1, wherein the processing circuit is associated with the second voltage domain.

3. The circuit as claimed in claim 1, wherein the processing circuit is associated with a third voltage domain, which is independent of the first voltage domain and has lower voltages and/or lower voltage differences, in terms of absolute value, than the first voltage domain.

4. The circuit as claimed in claim 1, wherein the controller comprises a first switch coupled between the signal input and a first connection of the first capacitor and a second switch coupled between the first connection of the first capacitor and a reference-ground potential node, wherein the controller is configured to close the first switch in the first operating phase, to open the first switch in the second and third operating phases, to open the second switch in the first operating phase, and to close the second switch in the second and third operating phases.

5. The circuit as claimed in claim 4, wherein the first switch and the second switch are associated with the first voltage domain.

6. The circuit as claimed in claim 5, wherein the controller comprises a third switch coupled between a second connection of the first capacitor and a common-mode voltage node, wherein the controller is configured to close the third switch in the first operating phase, and to open the third switch in the second and third operating phases.

7. The circuit as claimed in claim 4, wherein a second connection of the first capacitor is connected to a first connection of the second capacitor.

8. The circuit as claimed in claim 7, wherein the controller comprises a fourth switch coupled between the first connection of the second capacitor and the processing circuit, wherein the controller is configured to close the fourth switch in the third operating phase, and to open the fourth switch in the first and second operating phases.

9. The circuit as claimed in claim 7, wherein:
the controller is configured to connect a second connection of the second capacitor to the reference-ground potential node in the first and third operating phases and to connect the second connection of the second capacitor to a further reference-ground potential node in the second operating phase, wherein the further reference-ground potential node is configured provide a higher voltage than the reference-ground potential node.

10. The circuit as claimed in claim 9, wherein the further reference-ground potential node is configured provide a supply voltage to the processing circuit.

11. The circuit as claimed in claim 7, wherein the controller is configured to connect the second connection of the second capacitor to the reference-ground potential in the second operating phase and to connect the second connection of the second capacitor to a further reference-ground potential in the first and third operating phases, wherein the further reference-ground potential node is configured to provide a higher voltage than the reference-ground potential node.

12. The circuit as claimed in claim 1, wherein the processing circuit comprises a third capacitor, wherein the controller is configured to transfer charge from the second capacitor to the third capacitor in the third operating phase.

13. The circuit as claimed in claim 12, wherein the first capacitor, the second capacitor and/or the third capacitor comprises multiple single capacitors.

14. A circuit comprising:
a signal input for applying an input voltage,
a sampling capacitor,
a hold capacitor,
a measuring circuit, and
a control circuit configured to
cause the sampling capacitor to be charged using the input voltage applied to the signal input in a sampling phase,
cause charge to be transferred from the sampling capacitor to the hold capacitor in a holding phase, and
cause charge to be transferred from the hold capacitor to the measuring circuit in a conversion phase,
wherein the signal input is associated with a first voltage domain,
wherein the hold capacitor is associated with a second voltage domain,
wherein the first voltage domain is decoupled from the second voltage domain,
wherein the applied input voltage at the signal input is configured to have a first maximum voltage, and
wherein the hold capacitor, the measuring circuit and/or the control circuit are configured to operate at a lower voltage than the first maximum voltage.

15. The circuit as claimed in claim 14, wherein the circuit comprises a transistor associated with the first voltage domain and having a parasitic reverse diode, wherein the control circuit is configured to turn on the transistor to charge the sampling capacitor.

16. A method comprising:
charging a first capacitor using an input voltage in a first operating phase,
transferring charge from the first capacitor to a second capacitor in a second operating phase, and
transferring charge from the second capacitor to a processing circuit in a third operating phase,
wherein the input voltage is associated with a first voltage domain and the second capacitor is associated with a second voltage domain, which is independent of the first voltage domain.

17. The method as claimed in claim 16, wherein the transferring of the charge from the second capacitor to the processing circuit comprises charging a third capacitor of the processing circuit.

18. The method as claimed in claim 16, further comprising charging a further first capacitor using the input voltage or a further input voltage in a further first operating phase and transferring charge from the further first capacitor to a further second capacitor in a further second operating phase.

19. A circuit comprising:
a first capacitor,
a second capacitor,
a processing circuit, and
a controller configured to:
connect the first capacitor to a signal input in a first operating phase,
cause charge to be transferred from the first capacitor to the second capacitor in a second operating phase, and
cause charge to be transferred from the second capacitor to the processing circuit in a third operating phase, wherein the signal input belongs to a first voltage domain, the second capacitor belongs to a second voltage domain, and the first voltage domain is independent of the second voltage domain, wherein the controller comprises a first switch coupled between the signal input and a first connection of the first capacitor and a second switch coupled between the first connection of the first capacitor and a reference-ground potential node, wherein the controller is configured to close the first switch in the first operating phase, to open the first switch in the second and third operating phases, to open the second switch in the first operating phase, and to close the second switch in the second and third operating phases.

* * * * *